US006954620B2

United States Patent
Rotta et al.

(10) Patent No.: US 6,954,620 B2
(45) Date of Patent: Oct. 11, 2005

(54) RF POWER CONTROL SYSTEM INCLUDING WATCHDOG CIRCUIT

(75) Inventors: Phillip R. Rotta, Kirkland, WA (US); Frederick Bruce MacLachlan Hoornstra, Mountlake Terrace, WA (US)

(73) Assignee: The Boeing Company, Chicago, IL (US)

( * ) Notice: Subject to any disclaimer, the term of this patent is extended or adjusted under 35 U.S.C. 154(b) by 481 days.

(21) Appl. No.: 10/199,954

(22) Filed: Jul. 19, 2002

(65) Prior Publication Data

US 2004/0192247 A1 Sep. 30, 2004

(51) Int. Cl.[7] .............................................. H04B 17/00
(52) U.S. Cl. ................ 455/115.1; 455/127.1; 455/127.2; 455/127.3; 455/116
(58) Field of Search .......................... 455/127.2, 127.3, 455/127.1, 115.1, 115.3, 115.4, 116, 126

(56) References Cited

U.S. PATENT DOCUMENTS

| 4,274,156 A | * | 6/1981 | Trefney ................... 455/115.4 |
| 4,523,155 A | * | 6/1985 | Walczak et al. ............. 330/279 |
| 5,524,287 A | * | 6/1996 | Yokoya et al. ............... 455/126 |

FOREIGN PATENT DOCUMENTS

GB        0414352     *  6/1990

* cited by examiner

Primary Examiner—Vivian Chin
Assistant Examiner—Sanh Phu
(74) Attorney, Agent, or Firm—Harness Dickey & Pierce P.L.C.

(57) ABSTRACT

An RF power control system including a watchdog circuit for monitoring the power level of an RF signal about to be transmitted by an antenna and for monitoring the antenna beam scan angle and for adjusting and/or interrupting the RF signal in the event that the power level of the RF signal or the scan angle of the antenna beam exceed predetermined thresholds. The use of the watchdog circuit eliminates the need for stringent safety certification of a number of other subcomponents of the system and therefore significantly reduces the cost and time associated with obtaining regulatory certification of the system. In preferred forms, the watchdog circuit includes an enable input for allowing the watchdog circuit to be completely deactivated, and therefore transparent to the RF signal being generated. An optional status output allows the watchdog circuit to send a command to other components of the system and/or to a component requiring manual resetting by a user in the event that the watchdog circuit determines that the maximum power level has been exceeded.

24 Claims, 2 Drawing Sheets

US 6,954,620 B2

RF POWER CONTROL SYSTEM INCLUDING WATCHDOG CIRCUIT

FIELD OF THE INVENTION

The present invention relates to power control systems for monitoring the power level of a radio frequency (RF) signal being transmitted to a remote RF receiver. More particularly, the invention relates to an RF power control system incorporating a watchdog circuit for attenuating or interrupting an RF signal being input to a transmit antenna in an RF transmitting system when the power level of the RF signal exceeds a predetermined maximum power level.

BACKGROUND OF THE INVENTION

In certain applications, it is important to be able to employ some form of dynamic power control over the power of a radio frequency (RF) signal transmitted by an RF transmitting system. One form of conventional transmitting system is shown in FIG. 1. With reference to FIG. 1, the system includes a transmitter, a radio frequency amplifier, a transmit antenna, and a controller. The transmitter converts baseband signals to a modulated intermediate radio frequency power and up-converts this power to a radio frequency which is suitable for transmission via licensed radio communications channels, and electronically-compatible with the selected transmit antenna. The radio frequency power input level to the transmit antenna is determined by the amplifier, as commanded by the controller. The transmission system may include additional feedback loops to the controller for more precise control of the transmit antenna's radio frequency output power.

The system above may be used to transmit information from an aircraft to a space-based RF receiving system, such as an RF transponder carried by a satellite. Alternatively, such an RF transmitter system may be used at a ground based location, for example, at an airport, to communicate with mobile platforms, such as aircraft parked at a gate or taxiing to or from a runway, or even with other mobile platforms such as motor vehicles operating at the airport. When such an RF system is employed on an aircraft, it is extremely important that the power level of the transmitted RF signal be monitored and maintained within predetermined power levels to avoid causing interference with other RF receiver systems disposed within the vicinity of the target RF receiver system which is the intended recipient of the RF signals being transmitted. With such a system, a controller must be employed to continually adjust the transmit power of the RF transmitter in order to avoid interference with non-target RF receiver systems. Such power control is also required to compensate for weather, aircraft/satellite geometry, and increases/decreases in information transfer rate. The hardware and software components of an RF transmitting system capable of providing the needed degree of precision RF power output control can therefore be very complex.

An additional concern is the need to limit RF exposure levels of persons located in the vicinity of the transmit antenna to assure transmission power levels are in compliance with RF radiation safety levels developed by the Federal Communications Commission (FCC) in the U.S., and by the International Commission on Non-Ionizing Radiation Protection (ICNIRP) in Europe and elsewhere. When operating an RF transmitting system in ground-based applications, such as(for example) at an airport, the power flux density (PFD) of the radiated RF signal from the RF transmitter system must not under any circumstance exceed specific regulatory PFD levels. Although this safety-critical restriction can be technically maintained with the system shown in FIG. 1, formal certification of such a complex safety critical RF transmitter system can be impracticable due to the very high cost and considerable time required for such certification. Accordingly, there is significant need for an RF transmitter system that is capable of complying with strict regulatory safety requirements, but which still reduces and/or eliminates the need for the stringent safety critical level of certification for the majority of the system. Such an improved RF transmitting system would ideally require the stringent safety level of certification of fewer functionally partitioned subcomponent parts of the system and would therefore significantly reduce the time and cost associated with obtaining Federal Aviation Administration (FAA), FCC, ICNIRP, and other regulatory agency requirements for certification of the system.

SUMMARY OF THE INVENTION

The present invention is related to a power control system, including an independent watchdog circuit for monitoring and/or correcting the power level of an RF signal to be transmitted by a transmit antenna of the transmitting system. One preferred form the present invention includes a transmitter for generating an RF signal to be transmitted from the system. The transmitter presents the RF signal to an input of an RF amplifier, which in turn amplifies the signal in accordance with a desired degree of gain. A controller may be used to continuously monitor and adjust the gain level of the amplifier to thereby modify the power level of the amplified RF signal output by the RF amplifier.

The amplified RF signal produced by the RF amplifier is fed into an input of the watchdog circuit. The watchdog circuit operates independently of the controller and monitors the power level of the amplified RF signal. If the power level exceeds a predetermined maximum level, the watchdog circuit attenuates the amplified signal or completely interrupts the amplified RF signal. As long as the power level of the amplified RF signal remains below the predetermined maximum level, the watchdog circuit presents the amplified RF signal to a transmit antenna that radiates the signal into free space. Therefore, as long as the power level of the amplified RF signal remains below the predetermined maximum level, the watchdog circuit appears "transparent" to the amplified RF signal. Advantageously, since the watchdog circuit forms a functionally partitioned component which is not controlled by the controller, any malfunction of the controller, transmitter, or amplifier does not affect operation of the watchdog circuit itself.

By using the watchdog circuit, most of the system components do not require the more stringent safety certification levels. Only the simple watchdog function needs to be certified to the more stringent safety levels. Components such as the controller, amplifier, and transmitter can be certified to a much lower certification level and thus, the cost and time associated with the certification process will be significantly reduced.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or its uses.

Figure 2:
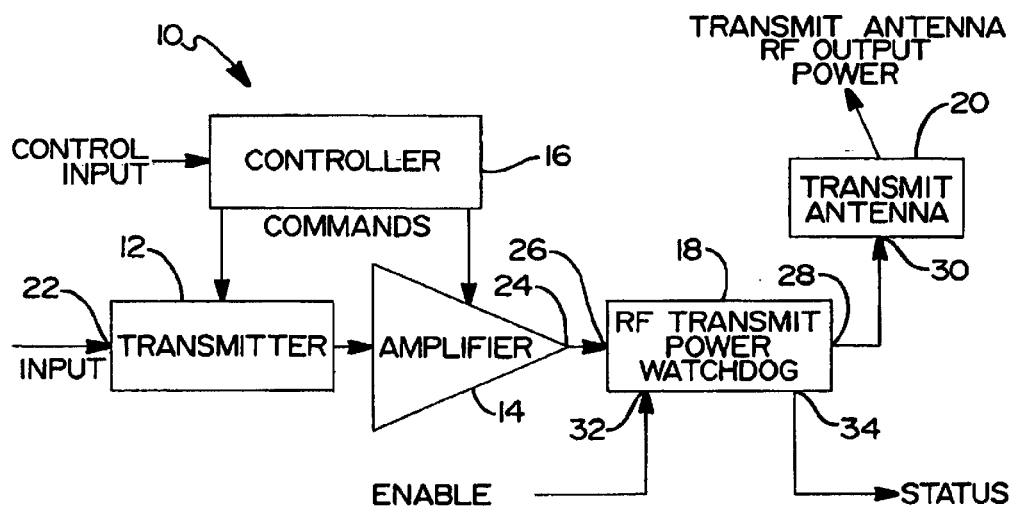
FIG. 2 is a view of a power control system in accordance with a preferred embodiment of the present invention.

Referring to FIG. 2, there is shown a power control system 10 in accordance with a preferred embodiment of the present invention. The power control system 10 generally includes a radio frequency (RF) transmitter 12, an RF amplifier 14, a controller 16, an RF transmit power watchdog circuit 18 and a transmit antenna 20. The RF transmitter 12 receives an electrical input signal (i.e., a data signal) at its input 22 and converts the electrical input signal into a modulated RF signal (i.e., into RF power). The RF signal is then directed into the RF amplifier 14 where it is amplified by the RF amplifier 14 in accordance with a desired degree of gain provided by the amplifier 14. The controller 16 monitors the amplified RF signal generated at an output 24 of the amplifier 14 and commands the RF transmitter 12 and/or Amplifier 14, as needed to maintain the amplified RF signal at the desired power level. The amplified RF signal is then directed into an input port 26 of the watchdog circuit 18. The watchdog circuit 18 forms a completely independent (i.e., "functionally partitioned") circuit for monitoring the power level associated with the amplified RF signal. If the power level at input port 26 exceeds a predetermined power flux density (PFD) threshold level, then the watchdog circuit 18 operates to attenuate the amplified RF signal to maintain the signal below the predetermined threshold PFD level, or alternatively to block the amplified RF signal from being forwarded to a transmit antenna 20. If the amplified RF signal is therefore below the predetermined maximum PFD level, the amplified RF signal is passed from an output port 28 of the watchdog circuit 18 to an input of the transmit antenna 20. The transmit antenna 20 then radiates the amplified RF signal into free space. In a preferred implementation, the maximum PFD threshold level for ground operation of the system 10 is settable independent of operational software and other control functions, and only during installation and maintenance of the system 10.

A principal advantage of the watchdog circuit 18 is that it operates independently of the controller 16, the amplifier 14, and the transmitter 12. Therefore, a malfunction of any one of these components will not affect operation of the watchdog circuit 18. Watchdog circuit 18 assures maximum PFD limits are not exceeded independent from the other components in the system 10. This, in turn, eliminates the need to certify the controller 16, amplifier 14, and transmitter 12 to the more stringent safety critical certification levels enforced by the regulatory agencies. Thus, only the watchdog circuit 18 needs to be certified to the more stringent safety levels. As will be appreciated, this significantly reduces the cost and expense associated with the certification process.

Referring further to FIG. 2, the watchdog circuit 18 preferably includes an enable port 32 that is able to receive an external signal for deactivating the watchdog circuit 18. This external signal may come from a separate component, for example, a separate controller, a switch, an aircraft air/ground indicator, an aircraft "weight-on-wheels" indicator, or other discrete component. Deactivating the watchdog circuit 18 makes the circuit 18 appear essentially "transparent" to the RF signal leaving the amplifier 14. The enable port 32 therefore allows the watchdog circuit 18 to be completely removed from the power control system 10 for those temporary occasions where a need for strict power control over the PFD of transmitted RF signal is not present. Such a condition will be present, for example, with an aircraft in flight where the transmit system can operate at full power since the general public cannot be in the vicinity of the transmitting antenna while the aircraft is in flight, and thus no RF exposure safety risk exists. .

Referring further to FIG. 2, the watchdog circuit 18 may also include a status port 34 for providing a status output signal. The status output signal, in one preferred application, can be used to inhibit operation of the amplifier 14 in the event of a condition where it would be desired/necessary to completely shut down the amplifier 14. Alternatively, the status output could be used to inform the controller 16 of a power level problem. In either event, the status output could be used to initiate a shutdown of the RF amplifier 14. Still further, the status output could be used to set a separate component that would require manual intervention by a user to reset the power control system 10 and/or one of its components, such as for example RF amplifier 14. The status output may also be used to illuminate an indicator to inform the crew when an RF signal is being generated.

Figure 3:
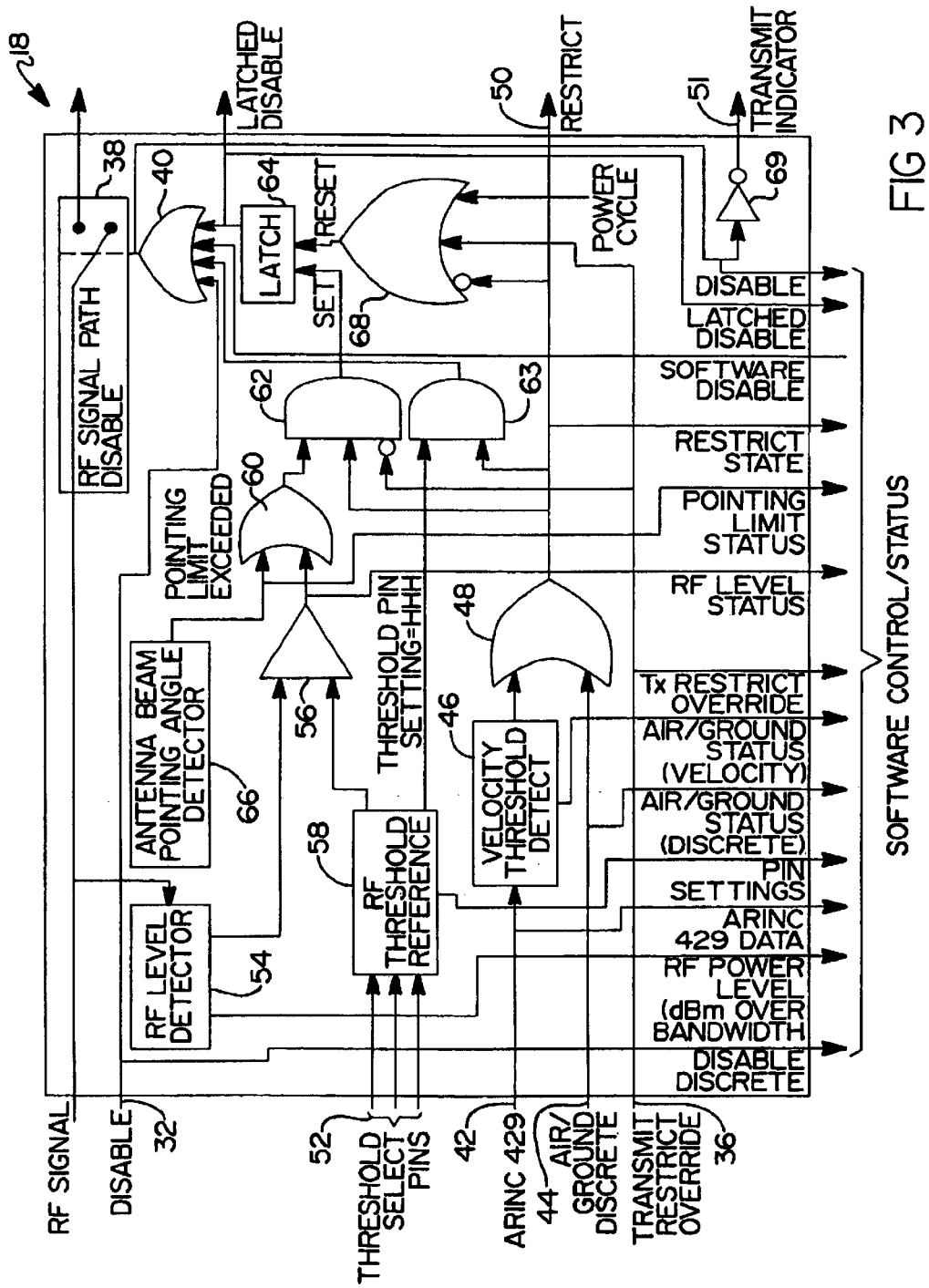
FIG. 3 is a simplified circuit diagram of one preferred implementation of the watchdog circuit.

Referring to FIG. 3, there is shown a more detailed, exemplary drawing of the watchdog circuit 18 of the present invention. It will be appreciated immediately that the circuit drawing of FIG. 18 is merely exemplary and that various modifications can be made to the circuit, such as substituting various ones of the logic gates shown with other components capable of performing similar functions. Also, while the following discussion of FIG. 3 will make reference to an "aircraft", it will be appreciated that the watchdog circuit 18 could easily be adapted for use with a variety of other forms of mobile platforms.

In FIG. 3, the watchdog circuit 18 preferably incorporates four modes of operation: "Normal", "Restrict", "Disable" and "Latched Disable". In the "Normal" mode, the monitoring function of the watchdog is deactivated, thus allowing full unrestricted transmitter, RF amplifier, and antenna power levels to be used. This mode could be used by an aircraft during airborne conditions where the risk of RF exposure to the general public is non-existent. In the "Restrict" mode, PFD monitoring is enabled. The watchdog circuit 18 will interrupt the RF signal path should the maximum acceptable safe transmit power for ground operations be exceeded, or should the transmit antenna 20 be pointed beyond a safe threshold pointing angle to assure a safe radiation level for individuals in the vicinity of the mobile platform, such as the general public, aircraft maintenance and/or airport ground personnel in the vicinity of an aircraft. A flight crew member can manually toggle a switch (not shown) at the disable input 32 to cause the watchdog to transition to "Disable" mode, where the RF output of the transmit antenna 20 is disabled. If while in the "Restrict" mode, either the transmit power threshold or an antenna beam pointing threshold is exceeded, the RF watchdog circuit 18 autonomously transitions to the "Latched Disable" mode, where the RF signal path to the transmit antenna 20 is shut down (i.e., is interrupted). In this instance, the RF signal path will remain shut down until a predetermined condition, such as the aircraft becoming airborne, transmit restrict override input 36 is toggled, or the system 10 has been powered down and re-powered up.

Referring further to FIG. 3, the RF signal path disable switch 38 is controlled by the output of an OR-gate 40. The output of OR-gate 40 either completes the RF signal path or breaks the RF signal path. Although this function could be implemented using an RF relay, a more preferred approach is for the OR-gate 40 to command a power-down to appropriate components in the RF signal path to ultimately shut down the RF signal to the antenna 20, or to shut down the RF signal radiating from the antenna. Thus, OR-gate 40 could be configured to power down the amplifier 14 and/or the transmit antenna 20.

Figure 1:
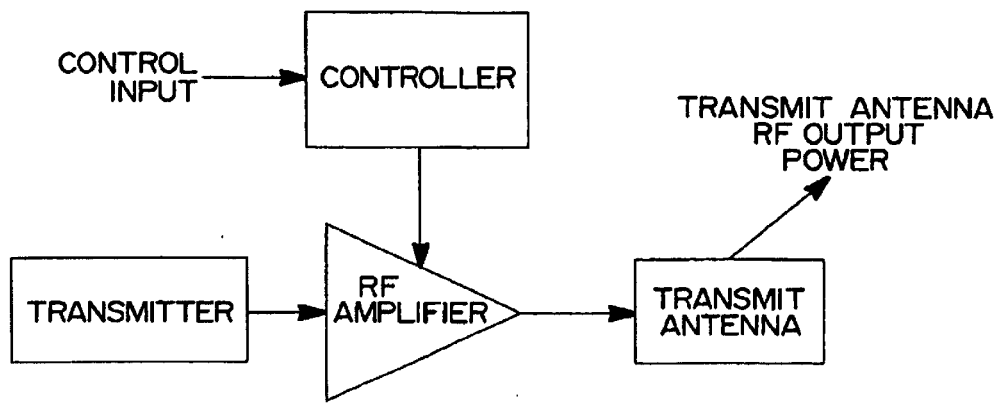
FIG. 1 is a view of a prior art RF transmitting system.

The enable function, implemented via port 32 of the watchdog circuit 18 in FIG. 1, is accomplished by an ARINC 429 data bus signal on circuit line 42 in FIG. 3 and an air-ground discrete input on circuit line 44. When either the velocity ("ground speed") provided by the ARINC 429 data bus or the air-ground discrete input indicate an aircraft "on the ground" condition, the watchdog circuit 18 monitor function becomes activated. When the aircraft is airborne, i.e., neither the velocity provided by the ARINC 429 data bus signal nor the air/ground discrete indicate an "on the ground" condition, the watchdog circuit 18 monitor function is deactivated, allowing an unrestricted RF output.

The ARINC 429 data bus is an ARINC industry standard aircraft navigation data bus available on most commercial aircraft for distribution of navigation data including ground speed. A velocity threshold detector circuit 46 receives a signal from circuit line 42 and uses the ground speed data provided from the ARINC 429 data bus to determine whether the aircraft is "airborne" or "on the ground". The "air/ground discrete" input is a signal generated by a mechanical switch (or equivalent function) that may be located at the landing gear of an aircraft. The air/ground discrete input is used as an indicator to determine when the aircraft is "on the ground" by monitoring for "weight on the wheels". The watchdog can use either the ARINC 429 data bus "ground speed" status and/or the "weight on wheels" status to determine whether an aircraft is "airborne" or "on the ground". The output of the velocity threshold detector circuit 46 and the air/ground discrete input on circuit line 44 are fed into an OR-gate 48 which indicates an "on the ground" condition and causes the watchdog to transition to "Restrict" mode. "Restrict" output 50 can be used to signal an external device when the aircraft is "on the ground".

With further reference to FIG. 3, transmit restrict override input 36 is coupled to a transmit override maintenance switch (not shown) that disables the watchdog circuit 18 monitor function for maintenance purposes. This allows full power operation under special maintenance conditions while the aircraft is on the ground.

Threshold select pins 52 are used to tailor the system 10 to a specific aircraft. By grounding various combinations of pins 52, the RF threshold reference for a specific aircraft can be tailored to optimize the system to allow a maximum safe transmit power level for the transmit antenna of a given aircraft. On a large aircraft, for example a Boeing 747 aircraft, it is safe to transmit on the ground at maximum power without affecting the general public, and thus an appropriate pin setting could be employed which allows for maximum transmit power during an "on the ground" condition. The safe level for smaller aircraft may require a lower power limit setting since the transmit antenna 20 will be physically much closer to the perimeter of the aircraft and closer to the ground (i.e., much closer to the individuals in the vicinity of the aircraft). By setting all of the threshold select pins 52 high, the RF threshold reference 58 will provide a signal to And-gate 63 to automatically disable all ground transmissions.

With further reference to FIG. 3, the watchdog circuit 18 includes an RF level detector 54 to indirectly monitor the antenna RF transmit power level during those times when transmit power level monitoring is required. If for some reason the non-safety critical control system (i.e., controller 16, amplifier 14, and transmitter 12 of FIG. 1), ground station controller or other subsystem affecting the system 10 were to malfunction, and the RF transmit power levels were to exceed a safe limit for ground operation, the watchdog circuit 18 would transition to the "Latched Disable" state. This function is implemented by a comparator 56 which detects if the output of the RF level detector 54 is higher than the acceptable RF threshold reference produced by a threshold reference circuit 58 in communication with the threshold select pins 52. OR-gate 60 and AND-gate 62 provide the needed logic to set a latch 64. Latch 64 provides one of the inputs to the OR-gate 40 that commands the RF signal path disable switch 38. Latch 64 maintains this disable state until one of the following conditions occurs:

1) The system 10 goes through a power cycle;
2) Transmit restrict override input 36 is switched to Override, then back to non-Override, causing the latch 64 to be cleared or reset; and
3) The RF watchdog circuit 18 transitions from "ground" status to "airborne" status, thus causing the circuit 18 to transition from "Latch Disable" mode to "Normal" mode operation.

With continued reference to FIG. 3, the watchdog circuit 18 further includes an antenna beam pointing angle detector 66 which, when the aircraft is on the ground, monitors the RF transmit beam pointing angle of the transmit antenna 20. If for some reason, the non-safety critical control system (i.e., controller 16, amplifier 14, transmitter 12) or other components affecting the system 10 were to malfunction and the antenna 20 was to point its beam at an unacceptable low pointing angle for safe operation, such a condition would be detected by the antenna beam pointing angle detector 66. The antenna beam pointing angle detector 66 would then cause the transmit RF power to be disabled. In operation, when the antenna beam pointing angle detector 66 detects an out of range antenna pointing angle, it provides an output to an input of OR-gate 60, which in turn provides an output to the AND-gate 62 which is used to set the latch 64. The latch 64 then drives the OR-gate 40, which in turn controls the RF signal path disable switch 38 to interrupt the RF signal path. The latch 64 maintains the disable state until one of the three conditions enumerated above occurs.

With continued reference to FIG. 3, an OR-gate 68 is used for clearing or resetting the latch 64. This causes the RF watchdog circuit 18 to transition out of a Latched Disable state any time one of the following three conditions is true:

1) the aircraft is "airborne" as detected by the signals on circuit lines 42 and 44, as well as the outputs from the velocity threshold detector 46 and the OR-gate 48; or
2) the transmit restrict override circuit line 36 is active; or
3) a power cycle is initiated.

With continued reference to FIG. 3, the watchdog circuit 18 further includes a transmit Indicator 51 to control an external indicator such as a light to status the flight crew any time the RF Signal Path is enabled. Inverter 69 (a typical implementation) serves as a line driver to an external indicator.

In view of the foregoing, it should be appreciated then that the power control system 10, by including a watchdog circuit 18, forms a relatively uncomplicated, cost efficient means by which the power level of an RF signal can be monitored and corrected to ensure that maximum regulatory power levels are not exceeded at any time during operation of the power control system 10. Importantly, the use of the watchdog circuit 18 eliminates the need for the more stringent safety certification of a number of other components of the system, thereby reducing the cost and time needed to obtain regulatory certification of the overall power control system 10.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A power control system for monitoring and controlling the power level of a radio frequency (RF) signal to be transmitted to a remotely located RF receiver, said power control system comprising:
   a transmitter for receiving an electrical input signal and generating said RF signal therefrom;
   an RF amplifier for amplifying said RF signal to produce an amplified RF signal;
   a watchdog circuit for receiving said amplified RF signal, monitoring said amplified RF signal to detect if said amplified RF signals exceeds a predetermined power level, and a modifying and interrupting said amplified RF signal if said amplified RF signal is detected as exceeding said predetermined power level.

2. The power control system of claim 1, wherein said watchdog circuit attenuates said amplified RF signal when said RF signal is detected as exceeding said predetermined power level.

3. The power control system of claim 1, further comprising an antenna having an input coupled to an output of said watchdog circuit.

4. The power control system of claim 1, wherein said watchdog circuit further comprises an enable input port for enabling said watchdog;
   and when a turn off signal is applied to said enable input port, said watchdog circuit is made inoperable and functions to pass through said amplified RF signal to an output thereof without modification.

5. The power control system of claim 1, wherein said watchdog circuit includes a status output port, said status output port being coupled to one of said RF amplifier and said antenna and serving to disable one of said RF amplifier and said antenna when a signal is generated at said status output port.

6. The power control system of claim 1, wherein said watchdog circuit includes a status output port, said status output port being coupled to said RF amplifier and serving to control an indicator to inform an operator of an attenuated amplified RF signal or a blocked amplified RF signal condition.

7. The power control system of claim 1, further comprising a controller operably associated with said RF amplifier for controlling said RF amplifier to generate a desired degree of gain for said amplified RF signal.

8. The power control system of claim 1, wherein said watchdog circuit comprises a circuit for monitoring a beam pointing angle of said transmit antenna and causing an interruption of said RF signal if said beam pointing angle exceeds a predetermined threshold angle.

9. The power control system of claim 1, wherein said watchdog circuit comprises an RF level detector circuit for monitoring a power level of said amplified RF signal.

10. The power control system of claim 1, wherein said watchdog circuit further comprises a suitable reference antenna pointing angle circuit for selling a maximum antenna beam pointing valve.

11. The power control system of claim 1, wherein said watchdog circuit includes a settable RF threshold reference circuit for selling a maximum RF power level value.

12. A power control system for monitoring and controlling the power level of a radio frequency (RF) signal to be transmitted to a remotely located RF receiver, said power control system comprising:
    a transmitter for receiving an electrical input signal and generating said RF signal therefrom;
    an RF amplifier for amplifying said RF signal to produce an amplified RF signal; and
    a watchdog circuit for receiving said amplified RF signal, monitoring said amplified RF signal to detect if said amplified RF signals exceeds a predetermined power level, and at least attenuating said amplified RF signal if said amplified RF signal is detected as exceeding said predetermined power level, said watchdog circuit further including an enable input port for enabling said watchdog circuit; and when a turn off signal is applied to said enable input port, said watchdog circuit is made inoperable and functions to pass through said amplified RF signal to said output thereof without any attenuation; and
    an antenna responsive to an output of said watchdog circuit for receiving
    said amplified RF signal and transmitting said amplified RF signal.

13. The power control system of claim 12, further comprising a controller for controlling said RF amplifier to cause said amplifier to provide a desired degree of gain to said amplified RF signal.

14. The power control system of claim 12, wherein said watchdog circuit includes a status output port, said status output port being coupled to said RF amplifier and serving to disable said amplifier when a signal is generated at said status output port.

15. The power control system of claim 12, wherein said watchdog circuit includes a status output port, said status output port being coupled to said RF amplifier and serving to control an indicator to inform an operator of an attenuated or blocked RF amplified signal condition.

16. A power control system for monitoring and controlling the power level of a radio frequency (RF) signal to be transmitted to a remotely located RF receiver, said power control system comprising:
    a transmitter for receiving an electrical input signal and generating said RF signal therefrom;
    an RF amplifier for amplifying said RF signal to produce an amplified RF signal;
    a controller for controlling said RF amplifier to cause a desired degree of gain to be generated for said amplified RF signal;
    a watchdog circuit for receiving said amplified RF signal, monitoring said amplified RF signal to detect if said amplified RF signals exceeds a predetermined power level, and attenuating or blocking said amplified RF signal if said amplified RF signal is detected as exceeding said predetermined power level;
    said watchdog circuit including an enable input port for receiving an enable signal, said enable signal when turned off, causing said watchdog circuit to pass through said amplified signal regardless of a power level of said amplified signal; and an antenna responsive to an output of said watchdog circuit for receiving said amplified RF signal and transmitting said amplified RF signal.

17. The power control system of claim 16, wherein said watchdog circuit further comprises a status output port in communication with said RF amplifier, said status output port operating to generate a signal for causing said RF amplifier to be disabled.

18. The power control system of claim 16, wherein said watchdog circuit further comprises a status output port in communication with an indicator, said status output port operating to control an indicator to inform an operator of an attenuated or blocked RF amplified signal condition.

19. The system of claim 16, wherein said watchdog circuit includes a settable RF threshold reference circuit for setting a maximum RF power level for said amplified RF signal.

20. The system of claim 16, wherein said watchdog circuit includes an RF power level detection circuit for detecting a power level of said amplified RF signal.

21. The system of claim 16, wherein said watchdog circuit includes an antenna beam pointing angle detector for detecting if a predetermined maximum pointing angle of said antenna is being exceeded.

22. A method for controlling a power level of a radio frequency (RF) signal to be transmitted to a remotely located RF receiver, said method comprising:

generating an amplified RF signal;

using a watchdog circuit to monitor a power level of said amplified RF signal and at least attenuating said amplified RF signal if said amplified RF signal exceeds a predetermined power level;

using said watchdog circuit to pass through amplified RF signal to an antenna, without attenuation, if said predetermined power level is not exceeded; and deactivating said watchdog circuit if a predetermined operating condition is met.

23. The method of claim 22, further comprising:

providing said watchdog circuit with a status output and using said status output to inform an operator of an attenuated or blocked RF amplified signal condition.

24. A method for controlling a power level of a radio frequency (RF) signal to be transmitted to a remotely located RF receiver, said method comprising:

generating an amplified RF signal;

using a watchdog circuit to monitor and control a power level of said amplified RF signal and at least attenuating said amplified RF signal if said amplified RF signal exceeds a predetermined power level; and using said watchdog circuit to detect a pointing angle of a beam of an antenna transmitting said RF amplified signal and blocking said amplified RF signal from reaching said antenna if a redetermined maximum beam pointing angle of said antenna is exceeded.

* * * * *